United States Patent
Park

(10) Patent No.: US 6,271,091 B1
(45) Date of Patent: *Aug. 7, 2001

(54) METHOD OF FABRICATING FLASH MEMORY CELL

(75) Inventor: Eun-Jeong Park, Chungcheongbuk-do (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/188,236

(22) Filed: Nov. 9, 1998

Related U.S. Application Data

(62) Division of application No. 08/898,552, filed on Jul. 22, 1997, now Pat. No. 5,874,759.

(30) Foreign Application Priority Data

Dec. 28, 1996 (KR) .................................................. 96-75711

(51) Int. Cl.$^7$ ................................................. H01L 21/336
(52) U.S. Cl. .......................... 438/267; 438/257; 438/263; 438/266
(58) Field of Search ..................................... 438/257, 258, 438/262, 263, 264, 265, 266, 267, 304

(56) References Cited

U.S. PATENT DOCUMENTS

| | | | |
|---|---|---|---|
| 4,794,565 | 12/1988 | Wu et al. .............................. 257/316 |
| 5,041,886 | * 8/1991 | Lee ....................................... 357/23.5 |
| 5,153,144 | * 10/1992 | Komori et al. ........................ 438/264 |
| 5,304,504 | * 4/1994 | Wei et al. .............................. 438/303 |
| 5,382,540 | 1/1995 | Sharma et al. ........................ 438/259 |
| 5,397,724 | 3/1995 | Nakajima et al. .................... 438/257 |
| 5,576,232 | * 11/1996 | Hong ..................................... 438/264 |
| 5,587,332 | 12/1996 | Chang et al. ......................... 257/315 |
| 5,614,747 | * 3/1997 | Ahn et al. ............................. 257/316 |
| 5,661,053 | * 8/1997 | Yuan ..................................... 438/257 |
| 5,686,332 | * 11/1997 | Hong ..................................... 438/261 |
| 5,712,179 | * 1/1998 | Yuan ..................................... 438/588 |
| 5,789,297 | * 8/1998 | Wang et al. .......................... 438/267 |

OTHER PUBLICATIONS

K. Naruke et al., "A New Flash–Erase EEPROM Cell with a Sidewall Select–Gate on its Source Side", IEDM, 1989, pp. 603–606.

\* cited by examiner

Primary Examiner—Charles Bowers
Assistant Examiner—Jack Chen
(74) Attorney, Agent, or Firm—Morgan, Lewis & Bockius LLP

(57) ABSTRACT

A method of fabricating a flash memory cell includes the steps of forming a field insulating layer on a substrate, forming a first gate oxide layer on the substrate, forming a floating gate, a first insulating layer and a control gate on the first gate oxide layer, forming sidewall insulating layers at both sides of the floating gate and the control gate, forming sidewall conductive layers on the sidewall insulating layers, and forming a source and drain region in the substrate.

13 Claims, 4 Drawing Sheets

METHOD OF FABRICATING FLASH MEMORY CELL

This is a divisional of application(s) Application No. 08/898,552 filed on Jul. 22, 1997, now U.S. Pat. No. 5,874,789.

This application claims the benefit of Korean Patent Application No. 96-75711 filed on Dec. 28, 1996, which is hereby incorporated by reference.

BACKGROUND OF THE INVENTION

1. Field of the Invention

The present invention relates to a semiconductor device, and more particularly, to a flash memory cell and a method of fabricating the same. Although the present invention is suitable for a wide scope of applications, it is particularly suitable for suppressing undesirable leakage current caused by an over-erasure.

2. Discussion of the Related Art

Generally, as a nonvolatile memory device, a flash memory cell having a laminated structure including a floating gate and a control gate maintains a high erasing rate by erasing memory array cells concurrently. The programming of the flash memory cell is carried out when hot electrons are injected into the floating gate from the channel by applying high voltage to the control gate. The ratio of the voltage applied to the floating gate to the voltage applied to the control gate is known as a coupling ratio. As the coupling ratio goes higher, the programming efficiency increases.

The erasure of the flash memory cell is achieved when high voltage is applied to a source region having a deep junction and electrons of the floating gate are injected into the source region or a substrate by the mechanism of Fowler-Nordheim tunneling. Generally, to enhance the erasing efficiency, the thickness of a gate oxide layer at the bottom part of the floating gate has to be reduced. However, the thin gate oxide layer may lower the voltage applied to the floating gate and thus reduce the coupling ratio. Therefore, it is required to maintain a higher coupling ratio to enhance the programming and erasure efficiencies without reducing the thickness of the gate oxide layer.

A conventional flash memory cell and a method of fabricating the same will now be explained with reference to FIG. 1.

FIG. 1 is a cross-sectional view of the conventional flash memory cell. As shown in FIG. 1, the conventional flash memory cell includes a semiconductor substrate 11, source and drain regions 24 and 23 in the substrate, a lightly-doped region 25 below the source region, a field oxide layer 13 at a field region of the substrate, a gate oxide layer 15 on the substrate 11 exclusive of a portion on the source and drain regions 24 and 23 and the field oxide layer 13, a floating gate 17 on the gate oxide layer 15, an interlevel insulating layer 19 on the floating gate 17, and a control gate 21 on the interlevel insulating layer.

FIGS. 2A through 2D are cross-sectional views illustrating the process steps for fabricating a conventional flash memory cell.

Referring to FIG. 2A, a field oxide layer 13 for defining an active region of a device is formed on the field region of a P-type substrate 11 using a LOCOS (Local Oxidation of Silicon) process. Then, thermal oxidation is performed on the exposed portion of the substrate 11 to form a gate oxide layer 15. After a polysilicon doped with impurity is deposited on the field oxide layer 13 and the gate oxide layer 15 by CVD (Chemical Vapor Deposition), a floating gate 17 is finally formed by patterning a deposited polysilicon into a stripe shape in a direction parallel to the substrate 11 using photolithography.

Referring to FIG. 2B, an interlevel insulating layer 19 having an ONO (Oxide-Nitride-Oxide) structure is formed on the floating gate 17.

Referring to FIG. 2C, after depositing a polysilicon layer on the interlevel insulating layer 19, a control gate 21 is formed by patterning the deposited polysilicon into a stripe shape in a direction perpendicular to the substrate 11 using photolithography. In this process, portions of the interlevel insulating layer 19, the floating gate 17, and the gate oxide layer 15 exclusive of portions overlapping the control gate 21 are also removed.

Referring to FIG. 2D, source and drain regions 23 and 24 are formed by heavily implanting impurities of N-type, which is the opposite conductivity type of the substrate 11, by using the control gate 21 as a mask. Then, a lightly-doped region 25 for forming a double diffusion drain structure is formed to partly overlap the floating gate 17 by lightly implanting N-type impurities to surround the drain region 24. In this process, the lightly-doped region 25 may be formed prior to forming the source and drain regions 23 and 24.

In the aforementioned flash memory device having the source region 23 connected to the ground, the device is programmed when the voltage Vg applied to the control gate 21 is higher than the voltage Vd applied to the drain region 24. Hot electrons generated in the channel are then injected into the floating gate 17. To erase programmed data in the flash memory cell, with the control gate 21 grounded, or with a negative voltage applied, the voltage Vs is applied to the source region and thus the electrons in the floating gate 17 are tunneled to the source region 23 or the substrate 11.

However, the aforementioned conventional flash memory cell has some problems. For example, since a thin gate oxide layer causes a coupling ratio to be small, the programming efficiency is low. On the other hand, the thick gate oxide layer results in a low erasing efficiency. Furthermore, when the gate oxide layer is too thin, the memory cell may be damaged by hot electrons injected into the floating gate during programming. As a result, the reliability of the cell is low and an over-erasure may also occur during repeated erasures due to hot holes trapped by the gate oxide layer.

SUMMARY OF THE INVENTION

Accordingly, the present invention is directed to a method of fabricating a flash memory cell that substantially obviates one or more of the problems due to limitations and disadvantages of the related art.

An object of the present invention is to provide a method of fabricating a flash memory cell to increase programming efficiency and to overcome low erasing efficiency.

Another object of the present invention is to provide a method of fabricating a flash memory cell to prevent a gate oxide layer from being damaged by hot electrons injected into the floating gate during programming.

Another object of the present invention is to provide a method of fabricating a flash memory cell to prevent cell information from being damaged due to leakage current caused by an over-erasure even with repeated erasures.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a flash memory cell includes the steps of forming a first gate oxide layer on a substrate of a first conductivity type, forming a floating gate being in a stripe shape in a first direction on the first gate oxide layer, forming an interlevel insulating layer, a control gate and a cap oxide layer being in a stripe shape in a second direction so as to perpendicularly superpose on the floating gate, and having first and second lateral surfaces, forming a sidewall insulating layer on the second lateral surfaces of the interlevel insulating layer, the control gate and the cap oxide layer, forming a lightly-doped region of a first conductivity type on the substrate on the second lateral surfaces of the control gate and the cap oxide layer, forming a second gate oxide layer on the first and second lateral surfaces of the floating gate and the control gate, forming a selection gate and an erase gate being in a sidewall form on the first and second lateral surfaces of the floating gate and the control gate, and forming a heavily-doped region of a second conductivity type on the substrate by using the cap oxide layer, the selection gate and the erase gate as a mask.

In another aspect of the present invention, a flash memory cell includes a semiconductor substrate, source and drain regions in the semiconductor substrate, a channel region having first and second channel region between the source and drain regions, a field oxide layer at a field region of the semiconductor substrate, a first gate oxide layer on the semiconductor substrate including the source and rain regions, a floating gate having first and second sides on the first gate oxide layer, a first insulating layer having first and second sides on the floating gate, a control gate having first and second sides on the first insulating layer, a second insulating layer having first and second sides on the control gate, a third insulating layer on the second sides of the second insulating layer including the control gate and the first insulating layer, a fourth insulating layer on the second side of the floating gate and the first sides of the second insulating layer including the control gate and the first insulating layer, a selection gate on the fifth insulating layer, an erasure gate on the fourth insulating layer including the third insulating layer, and a lightly-doped region in the semiconductor substrate, the lightly-doped region being partly overlapped with the floating gate.

In another aspect of the present invention, a method of fabricating a flash memory cell having a semiconductor substrate, the method includes the steps of forming a field oxide layer at a field region of the semiconductor substrate, forming a first gate oxide layer on the semiconductor substrate, forming a floating gate having first and second sides on the first gate oxide layer, forming a first insulating layer having first and second sides on the floating gate, forming a control gate having first and second sides on the first insulating layer, forming a second insulating layer having first and second sides on the control gate, forming a third insulating layer on the second sides of the second insulating layer including the control gate and the first insulating layer, forming a fourth insulating layer on the second side of the floating gate and the first sides of the second insulating layer including the control gate and the first insulating layer, forming a lightly-doped region in the semiconductor substrate to be partly overlapped with the floating gate, forming a selection gate and an erasure gate on the fourth insulating layer and the third insulating layer, respectively, and forming source and drain regions in the semiconductor substrate.

In a further aspect of the present invention, a method of fabricating a flash memory cell having a semiconductor substrate, the method includes the steps of forming a field oxide layer at a field region of the semiconductor substrate, forming a gate oxide layer on the semiconductor layer, forming a polysilicon layer on an exposed surface over the semiconductor substrate, forming a first insulating layer having first and second sides on the polysilicon layer, forming a control gate having first and second sides on the first insulating layer, forming a second insulating layer having first and second sides on the control gate, forming a third insulating layer on the first and second sides of the first insulating layer, the control gate, and the second insulating layer, forming a first photoresist layer on an exposed surface over the semiconductor substrate, removing a portion of the first photoresist layer to expose portions of the polysilicon layer including a portion of the third insulating layer on the first sides of the first insulating layer, the control gate, and the second insulating layer, removing the portions of the polysilicon layer exposed including the third insulating layer, removing the first photoresist layer, forming a second photoresist layer on an exposed surface over the semiconductor substrate exclusive of the polysilicon layer, removing the polysilicon layer to form a floating gate having first and second sides on the gate oxide layer, forming a lightly-doped region on the semiconductor substrate, forming selection gate and erasure gate on the fourth insulating layer and the third insulating layer, respectively, and removing the second photoresist layer forming a fourth insulating layer on the first sides of the first insulating layer, the control gate, and the second insulating layer and on the first and second sides of the floating gate, forming source and drain region on the semiconductor substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiment of the present invention, examples of which are illustrated in the accompanying drawings.

Figure 1:
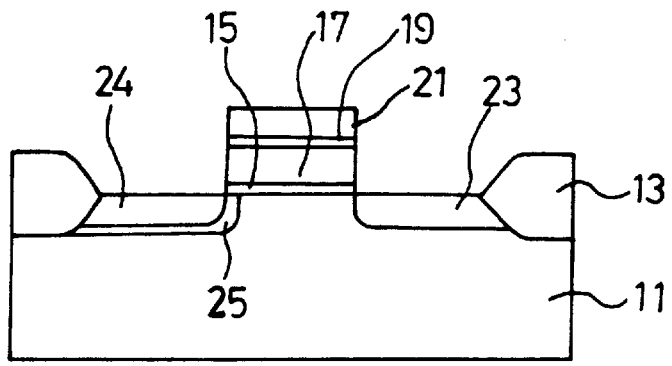
FIG. 1 is a cross-sectional view of a conventional flash memory cell.
Figure 2A:
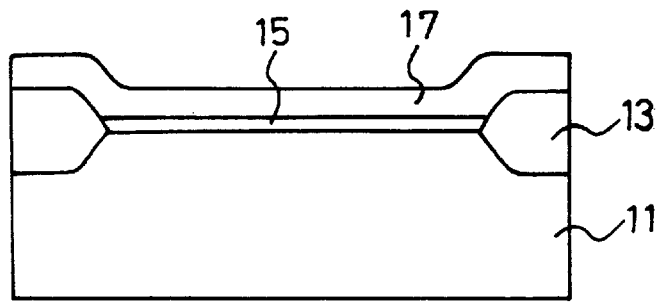
FIGS. 2A through 2D are cross-sectional views illustrating the process steps for fabricating the conventional flash memory cell.
Figure 2B:
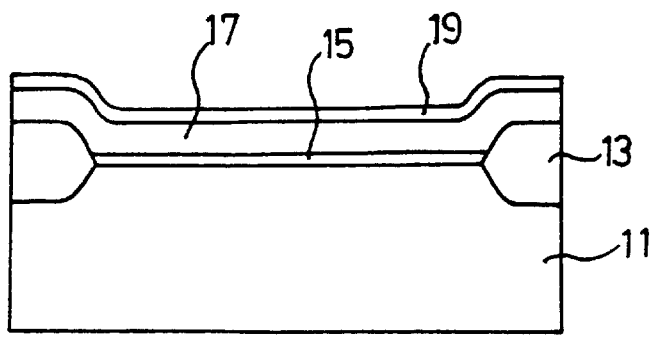
Figure 2C:
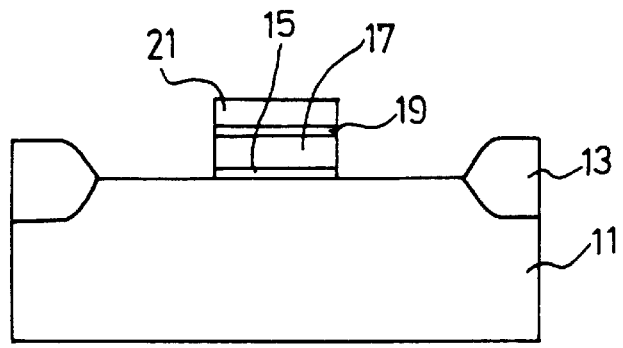
Figure 2D:
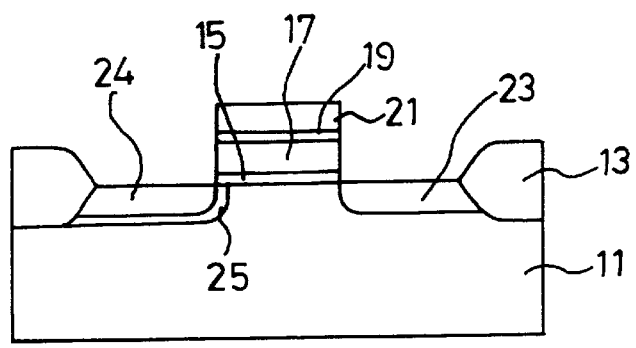
Figure 3:
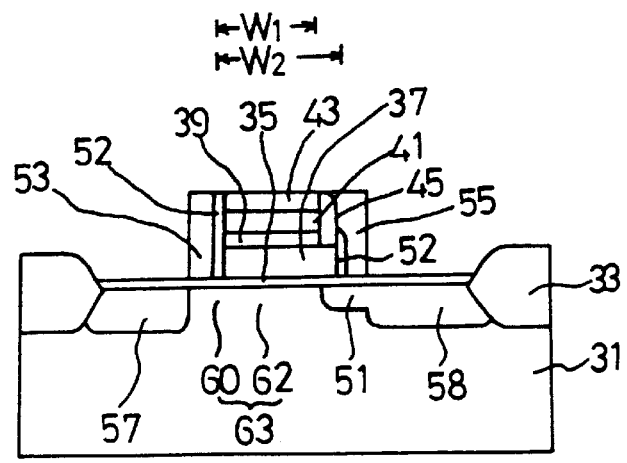
FIG. 3 is a cross-sectional view of a flash memory cell in accordance with a preferred embodiment of the present invention.

Referring to FIG. 3, source and drain regions 57 and 58 are formed in a semiconductor substrate 31. A channel region 63 having first and second channel regions 60 and 62 are formed between the source and drain region 57 and 58. A field oxide layer 33 is formed at a field region of the substrate 31. A first gate oxide layer 35 is formed on the substrate 31 excluding the field oxide layer 33. A floating gate 37 is formed having first and second sides is formed on the first gate oxide layer 35. An interlevel insulating layer 39 having first and second sides is formed on the floating gate 37. A lightly-doped region 51 is formed at the drain region to have a portion partly overlapping an edge of the floating gate 37.

A control gate 41 having first and second sides is then formed on the interlevel insulating layer 39. A cap oxide layer 43 having first and second sides is formed on the control gate 41. A sidewall insulating layer 45 having a thickness in the range of about 500 to 700 Å is formed on the second sides of the cap oxide layer 43, the control gate 41, and the interlevel insulating layer 39. A second gate oxide layer 52 is formed on the second side of the floating gate 37. PSG (Phosphor Silicate Glass), BSG (Boro Silicate Glass), and BPSG (Boro Phosphor Silicate Glass) are examples of the second gate oxide layer 52. An oxide layer 54 made from one of PSG, BSG, and BPSG is also formed on the first sides of the floating gate 37, the interlevel insulating layer 39, the control gate 41, and the cap oxide layer 43. A selection gate 53 is formed on the oxide layer thereon. An erasure gate 55 is formed on the second gate oxide layer 52 and the sidewall insulating layer 45.

Figure 4A:
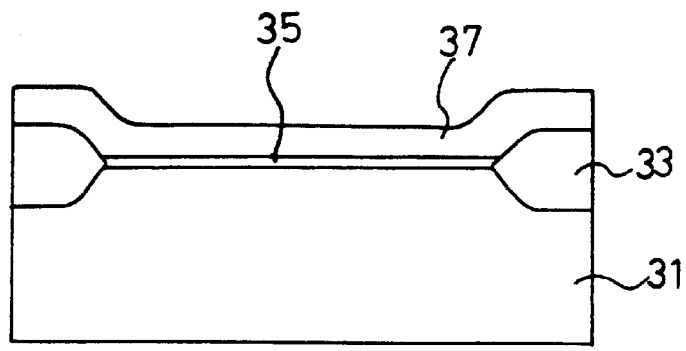
FIGS. 4A through 4E are cross-sectional views illustrating the process steps for fabricating a flash memory cell in accordance with the preferred embodiment of the present invention.

Referring to FIG. 4A, a field oxide layer 33 for defining an active region of the device is formed on the field region of a P-type substrate 31 using a LOCOS process. An exposed portion of the substrate 31 is treated with thermal oxidation so as to form a first gate oxide layer 35 having a thickness of preferably 200 to 500 Å. A polysilicon 37 doped with an impurity for forming a floating gate is then deposited to have a thickness in the range of preferably 3000 to 4000 Å on the field oxide layer 33 and the first gate oxide layer 35 by CVD.

Figure 4B:
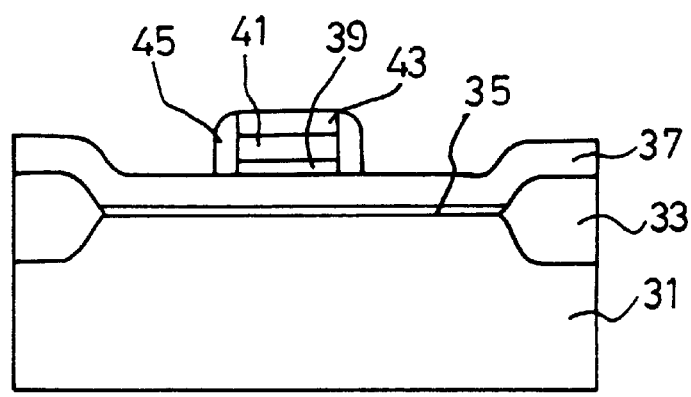

Referring to FIG. 4B, an interlevel insulating layer 39 of an ONO structure having a thickness in the range of preferably 200 to 500 Å is formed on the polysilicon layer 37. Then, a polysilicon layer doped with an impurity is deposited using CVD to have a thickness in the range of preferably 3000 to 4000 Å on the interlevel insulating layer 39. Subsequently, a silicon oxide layer is deposited using CVD on the polysilicon layer to have a thickness in the range of preferably 3000 to 4000 Å. The polysilicon and the silicon oxide are patterned in a stripe shape using photolithography to define a control gate 41 and a cap oxide layer 43 having first and second sides. Concurrently, the interlevel insulating layer 39 is also patterned in this process.

Subsequently, an insulating material having a etching rate different from the silicon oxide is deposited on the entire surface of the aforementioned structure using CVD. For example, PSG (Phosphor Silicate Glass), BSG (Boro Silicate Glass), and BPSG (Boro-Phosphor Silicate Glass) can be used in this process. The deposited insulating material is then etched back by means of anisotropic etching, such as reactive ion etching, so as to expose the cap oxide layer 43 and the polysilicon layer 37. After this step, a sidewall insulating layer 45 having a thickness in the range of preferably 500 to 700 Å is formed on the first and second sides of the control gate 41 and the cap oxide layer 43. At this time, the cap oxide layer 43 is not etched because its etching rate is different from the etching rate of the insulating material used in the previous steps.

Figure 4C:
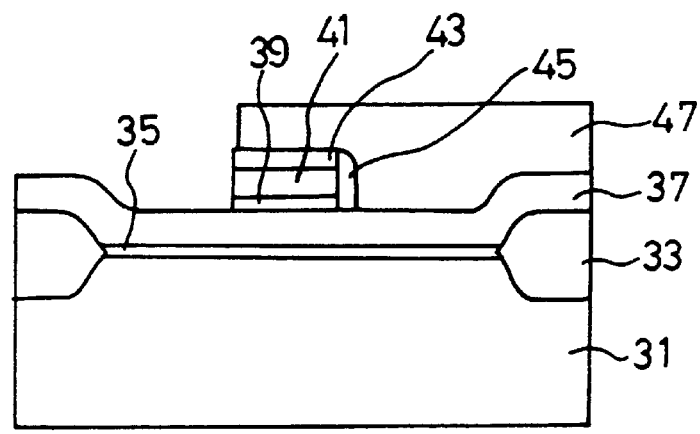

Referring to FIG. 4C, after depositing a first photoresist 47 on the entire surface of the above-described structure, one side of the polysilicon layer 37 including one of the sidewall insulating layer 45 on the first side of the control gate 41 and the cap oxide layer 43 is exposed by carrying out an exposure and development process on the first photoresist 47. Next, wet etching is performed to remove the exposed sidewall insulating layer 45 on the first sides of the control gate 41 and the cap oxide layer 43 by using the first photoresist 47 as a mask.

Figure 4D:
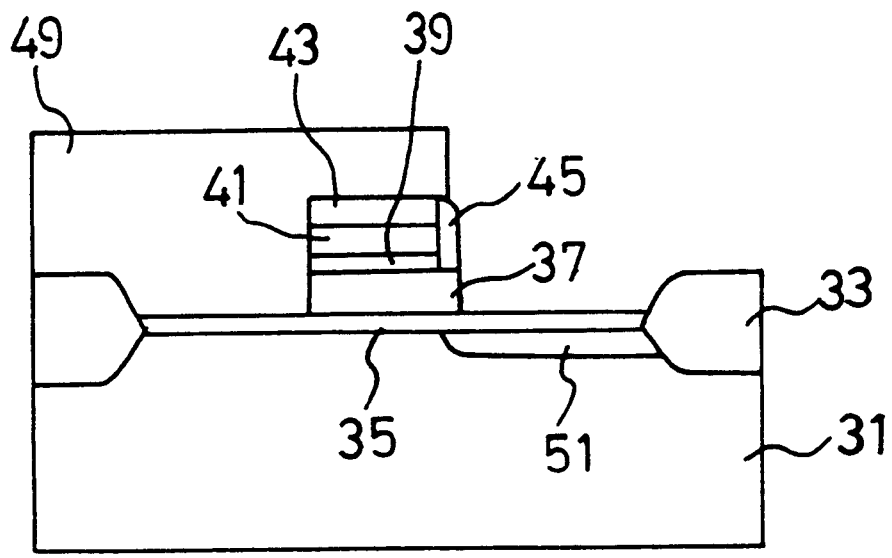

As shown in FIG. 4D, the first photoresist 47 is removed. The floating gate 37 is then formed by anisotropic etching the polysilicon layer 37 using the cap oxide layer 43 and a portion of the insulating layer 45 remaining on the second sides of the control gate 41 and the cap oxide layer 43 as masks. After depositing a second photoresist 49 on the entire surface over the substrate 31, the other side of the floating gate 37 is exposed by carrying out an exposure and development process on the second photoresist 49. Then, N-type impurities, such as phosphorus (P) or arsenic (As), are lightly implanted into the exposed portion of the substrate 31. A lightly-doped region 51 is thus formed by using the second photoresist 49 as a mask. The lightly-doped region 51 partly overlaps the edge of the floating gate 37.

Figure 4E:
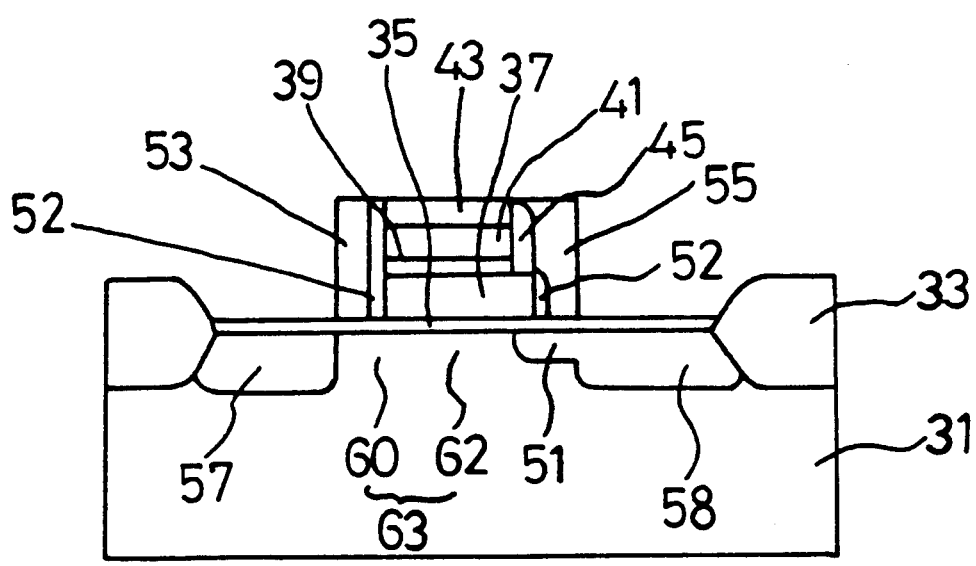

Referring to FIG. 4E, the second photoresist 49 is removed. Then, oxidation is performed on the exposed first and second sides of the floating gate 37 and the control gate 41 to form a second gate oxide layer 52 having a thickness in the range of preferably 200 to 400 Å. A polysilicon doped with impurity is deposited by CVD on the exposed surfaces and etched back by means of anisotropic etching, such as reactive ion etching so as to expose the cap oxide layer 43 and the first gate oxide layer 35. Then, a selection gate 53 and an erasure gate 55 are formed on the first and second sides of the floating gate 37 and the control gate 41. The erasure gate 55 is formed to overlap the lightly-doped region 51.

Then, source and drain regions 57 and 58 are formed by heavily implanting N-type impurities such as phosphorus (P) or arsenic (As) on an exposed portion of the substrate 31 by using the cap oxide layer 43, the selection gate 53, and the erasure gate 55 as masks. A portion of the lightly-doped region 51 that does not overlap the erasure gate 55 overlaps the drain region 58. A channel 63 below the floating gate 37 and the selection gate 53 is formed between the source region 57 and the lightly-doped region 51. The channel 63 includes first and second channel regions 60 and 62 controlled by the selection gate 53 and the floating gate 37, respectively.

The flash memory cell according to the present invention includes the selection gate 53 for determining the selection of cells, the control gate 41 for controlling the programming and erasing of the cell, the floating gate 37 for storing electrons in programming, and the erasure gate 55 for erasing the cell by tunneling the electrons stored in the floating gate 37 through the second gate oxide layer 52.

The flash memory cell is programmed by a source lateral injection of the hot electrons into the floating gate 37. In other words, after turning on the first channel region 60 by applying a low voltage over a threshold voltage to the selection gate 53, the hot electrons generated in the first channel region 60 are injected into the floating gate 37 when a high voltage is applied to the control gate 41 and the drain region 58. As a result, the cell is programmed. As described above, the source lateral injection of the hot electrons into the floating gate 37 increases the programming speed of the cell and the thick first gate oxide layer 35 improves the coupling effect, so that the programming efficiency of the cell is improved.

Contrary to the programming, the cell is erased when the electrons injected into the floating gate 37 are tunneled through the second gate oxide layer 52 to the erasure gate 55 by the Fowler-Nordheim mechanism. In other words, the cell is erased when the control gate 41 and the drain region 58 are applied with a voltage higher than the voltage applied in programming the cell. Thus the electrons injected into the floating gate 37 are tunneled into the second gate oxide layer 52.

If a negative voltage is applied to the selection gate 53 and the control gate 41, the cell can be erased with a relatively low voltage. According to the present invention, the reliability of the first gate oxide layer can be improved due to the tunneling of the electrons injected into the floating gate 37 to the erase gate 55 through the thin second gate oxide layer 52. Further, when the negative voltage is applied to the selection gate 53 and thus turning-off the first channel region 60, the leakage current caused by an over-erasure is greatly suppressed.

It will be apparent to those skilled in the art that various modifications and variations can be made in the method of fabricating a flash memory cell in accordance with the present invention without departing from the spirit or scope of the invention. Thus, it is intended that the present invention cover the modifications and variations of this invention provided they come within the scope of the appended claims and their equivalents.

What is claimed is:

1. A method of fabricating a flash memory cell, comprising the steps of:
    forming a field insulating layer on a substrate;
    forming a first gate oxide layer on the substrate;
    forming a floating gate, a first insulating layer and a control gate on the first gate oxide layer;
    forming sidewall insulating layers at both sides of the floating gate and the control gate, wherein a first side of the sidewall insulating layers on the floating gate and the first side of the sidewall insulating layers on the control gate are formed at different times, and the first side of the sidewall insulating layers on the control gate acts as a mask in forming both the floating gate and a source/drain region;
    forming sidewall conductive layers on the sidewall insulating layers; and
    forming a source and drain region in the substrate.

2. The method according to claim 1, wherein the steps of forming a floating gate, a first insulating layer and a control gate include the steps of:
    depositing a first polysilicon layer on the first gate oxide layer;
    depositing an insulating layer on the first polysilicon layer to form a first insulating layer;
    depositing a second polysilicon layer to form a control gate;
    forming a first sidewall insulating layer on a first side of the control gate; and
    patterning the first polysilicon layer to form a floating gate.

3. The method according to claim 1, wherein a second side of the sidewall insulating layers includes the sidewall insulating layers formed on second sides of the control gate and the floating gate.

4. The method according to claim 1, wherein the first side of the sidewall insulating layers formed on the control gate is thicker than the first side of the sidewall insulating layers formed on the floating gate.

5. The method according to claim 1, wherein a thickness of the first side of the sidewall insulating layers formed on the floating gate is about 200 to 400 Å.

6. The method according to claim 1, wherein a length of the floating gate is larger than that of the control gate.

7. The method according to claim 1, wherein the sidewall conductive layers are polysilicon layers.

8. The method according to claim 1, further comprising the step of: forming a lightly-doped drain region in the substrate below a first side of the floating gate after forming the sidewall insulating layers.

9. The method according to claim 2, further comprising the step of:
    forming lightly-doped drain region in the substrate below a first side of the control gate after patterning the first polysilicon layer.

10. The method according to claim 1, wherein the step of forming a first gate oxide layer includes thermal oxidation.

11. The method according to claim 1, wherein the step of forming sidewall insulating layers include one of CVD and thermal oxidation.

12. The method according to claim 1, wherein the step of forming sidewall insulating layers are one of PSG, BSG and BPSG.

13. The method according to claim 3, wherein the second side of the sidewall insulating layers are formed of thermal oxidation.

* * * * *